(12) United States Patent
Wang et al.

(10) Patent No.: US 8,816,495 B2
(45) Date of Patent: Aug. 26, 2014

(54) STRUCTURES AND FORMATION METHODS OF PACKAGES WITH HEAT SINKS

(75) Inventors: Chung Yu Wang, Hsin-Chu (TW); Shih-Yi Syu, Daxi Township (TW); Jing-Cheng Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 115 days.

(21) Appl. No.: 13/398,672

(22) Filed: Feb. 16, 2012

(65) Prior Publication Data

US 2013/0217188 A1    Aug. 22, 2013

(51) Int. Cl.
*H01L 23/34* (2006.01)

(52) U.S. Cl.
USPC .......................................................... 257/713

(58) Field of Classification Search
None
See application file for complete search history.

(56) References Cited

U.S. PATENT DOCUMENTS

| | | |
|---|---|---|
| 4,811,082 A | 3/1989 | Jacobs et al. |
| 4,990,462 A | 2/1991 | Sliwa, Jr. |
| 5,075,253 A | 12/1991 | Sliwa, Jr. |
| 5,380,681 A | 1/1995 | Hsu |
| 5,481,133 A | 1/1996 | Hsu |
| 6,002,177 A | 12/1999 | Gaynes et al. |
| 6,187,678 B1 | 2/2001 | Gaynes et al. |
| 6,229,216 B1 | 5/2001 | Ma et al. |
| 6,236,115 B1 | 5/2001 | Gaynes et al. |
| 6,271,059 B1 | 8/2001 | Bertin et al. |
| 6,279,815 B1 | 8/2001 | Correia et al. |
| 6,355,501 B1 | 3/2002 | Fung et al. |
| 6,434,016 B2 | 8/2002 | Zeng et al. |
| 6,448,661 B1 | 9/2002 | Kim et al. |
| 6,461,895 B1 | 10/2002 | Liang et al. |
| 6,562,653 B1 | 5/2003 | Ma et al. |
| 6,570,248 B1 | 5/2003 | Ahn et al. |
| 6,600,222 B1 | 7/2003 | Levardo |
| 6,607,938 B2 | 8/2003 | Kwon et al. |
| 6,661,085 B2 | 12/2003 | Kellar et al. |
| 6,762,076 B2 | 7/2004 | Kim et al. |
| 6,790,748 B2 | 9/2004 | Kim et al. |
| 6,887,769 B2 | 5/2005 | Kellar et al. |
| 6,908,565 B2 | 6/2005 | Kim et al. |
| 6,908,785 B2 | 6/2005 | Kim |
| 6,924,170 B2 * | 8/2005 | Ravi et al. ..................... 438/105 |
| 6,924,551 B2 | 8/2005 | Rumer et al. |
| 6,943,067 B2 | 9/2005 | Greenlaw |
| 6,946,384 B2 | 9/2005 | Kloster et al. |
| 6,975,016 B2 | 12/2005 | Kellar et al. |
| 7,037,804 B2 | 5/2006 | Kellar et al. |
| 7,056,807 B2 | 6/2006 | Kellar et al. |
| 7,087,538 B2 | 8/2006 | Staines et al. |
| 7,151,009 B2 | 12/2006 | Kim et al. |
| 7,157,787 B2 | 1/2007 | Kim et al. |
| 7,183,132 B2 * | 2/2007 | Nakamura ..................... 438/106 |
| 7,215,033 B2 | 5/2007 | Lee et al. |
| 7,276,799 B2 | 10/2007 | Lee et al. |
| 7,279,795 B2 | 10/2007 | Periaman et al. |
| 7,307,005 B2 | 12/2007 | Kobrinsky et al. |
| 7,317,256 B2 | 1/2008 | Williams et al. |
| 7,320,928 B2 | 1/2008 | Kloster et al. |
| 7,345,350 B2 | 3/2008 | Sinha |

(Continued)

*Primary Examiner* — Scott B Geyer
(74) *Attorney, Agent, or Firm* — Slater and Matsil, L.L.P.

(57) ABSTRACT

A device includes a package component, and a die over and bonded to the package component. The die includes a substrate. A heat sink is disposed over and bonded to a back surface of the substrate through direct bonding.

16 Claims, 6 Drawing Sheets

(56) References Cited

U.S. PATENT DOCUMENTS

| | | |
|---|---|---|
| 7,402,442 B2 | 7/2008 | Condorelli et al. |
| 7,402,515 B2 | 7/2008 | Arana et al. |
| 7,410,884 B2 | 8/2008 | Ramanathan et al. |
| 7,432,592 B2 | 10/2008 | Shi et al. |
| 7,494,845 B2 | 2/2009 | Hwang et al. |
| 7,528,494 B2 | 5/2009 | Furukawa et al. |
| 7,531,890 B2 | 5/2009 | Kim |
| 7,557,597 B2 | 7/2009 | Anderson et al. |
| 7,576,435 B2 | 8/2009 | Chao |
| 7,834,450 B2 | 11/2010 | Kang |

* cited by examiner

STRUCTURES AND FORMATION METHODS OF PACKAGES WITH HEAT SINKS

BACKGROUND

In some Three-Dimensional Integrated Circuits (3DIC), device dies are first bonded to an interposer, which is further bonded to a package substrate to form a package. The heat generated in the device dies during their operation needs to be dissipated. In the conventional structures, to dissipate the heat, the substrates of the device dies are attached to a heat spreader, which has a size larger than the sizes of the device dies and the package substrate. Accordingly, the heat generated in the device dies is spread to a larger area. A heat sink is attached to the heat spreader to dissipate the heat conducted to the heat spreader.

The attachment of the device dies to the heat sink is through a Thermal Interface Material (TIM), which may include an epoxy-based material. In addition, some thermal conductive materials such as silicon particles may be mixed in the epoxy-based material to increase the thermal conductivity of the TIM. The attachment of the heat sink to the heat spreader is through another TIM. Due to the use of two TIMs, the efficiency in the heat dissipation is reduced.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

A package including a heat sink and the methods of forming the same are provided in accordance with various exemplary embodiments. The intermediate stages of forming the package are illustrated. The variations of the embodiments are discussed. Throughout the various views and illustrative embodiments, like reference numbers are used to designate like elements.

Figure 1:
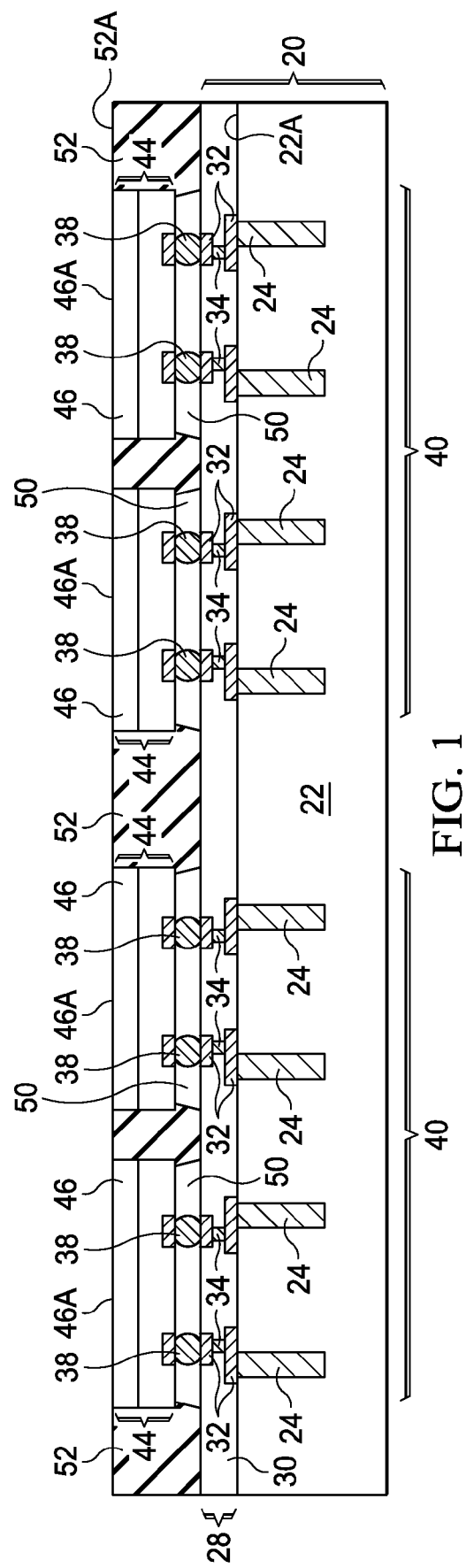
FIGS. 1 through 6 are cross-sectional views of intermediate stages in the manufacturing of a package in accordance with some exemplary embodiments.

FIG. 1 illustrates a cross-sectional view of package component 20. Package component 20 includes substrate 22. In some embodiments, substrate 22 is a semiconductor substrate, which may further be a crystalline silicon substrate, although it may be formed of other semiconductor materials such as silicon germanium, silicon carbon, or the like. In alternative embodiments, substrate 22 is a dielectric substrate. Package component 20 may be a device wafer, which includes active devices such as transistors (not shown) formed at surface 22A of semiconductor substrate 22. When package component 20 is a device wafer, it may also include passive devices (not shown) such as resistors and/or capacitors. In alternative embodiments, package component 20 is an interposer wafer that does not include active devices therein. In these embodiments, package component 20 may, or may not, include passive devices formed therein. Through Vias (TVs) 24 may be formed to extend from top surface 22A of substrate 22 into substrate 22. TVs 24 are also sometimes referred as through-substrate vias or through-silicon vias when substrate 22 is a silicon substrate. Package component 20 includes a plurality of package components 40, which may be identical to each other. Package components 40 may be device chips (also known as dies when sawed apart), interposer chips, or the like. Package components 40 are alternatively referred to as chips or dies 40 hereinafter.

Interconnect structure 28 is formed over substrate 22, and is used to electrically connect to the integrated circuit devices, if any, and/or TVs 24. Interconnect structure 28 may include a plurality of dielectric layers 30. Metal lines 32 are formed in dielectric layers 30. Vias 34 are formed between, and interconnecting, the overlying and underlying metal lines 32. Metal lines 32 and vias 34 are sometimes referred to as Redistribution Lines (RDL) 32/34. In some embodiments, dielectric layers 30 comprise silicon oxide, silicon nitride, silicon carbide, silicon oxynitride, combinations thereof, and/or multi-layers thereof. Alternatively, dielectric layers 30 may comprise one or more low-k dielectric layer having a low k value(s). The k values of the low-k dielectric materials in dielectric layers 30 may be lower than about 3.0, or lower than about 2.5, for example.

Connectors 38 are formed at the top surface of package component 20. In some embodiments, connectors 38 comprise metal pillars, wherein solder caps may be, or may not be, formed on the top surfaces of the metal pillars. In alternative embodiments, connectors 38 comprise solder regions. In yet other embodiments, connectors 38 may be composite bumps comprising copper posts, nickel layers, solder caps, Electroless Nickel Immersion Gold (ENIG), Electroless Nickel Electroless Palladium Immersion Gold (ENEPIG), and/or the like.

Package components 44 are bonded to package component 20, for example, through flip-chip bonding. Connectors 38 accordingly bond, and electrically couple, the circuits in package components 44 to RDLs 32 and TVs 24 in package component 20. Package components 44 may be device dies including logic circuits, memory circuits, or the like. Accordingly, package components 44 are alternatively referred to as dies 44 hereinafter. Alternatively, package components 44 may be packages that include dies bonded to the respective interposers, package substrates, and/or the like. On each of dies 40, there may be two or more dies 44 bonded thereon. In some embodiments, dies 44 include substrates 46, which may be silicon substrates in some embodiments. In alternative embodiments, substrates 46 are formed of materials such as silicon germanium, silicon carbide, III-V compound semiconductors, or the like. Accordingly, surfaces 46A of substrates 46 are the surfaces of silicon, silicon germanium, silicon carbide, a III-V compound semiconductor, or the like.

Next, polymer 50 is dispensed into the gaps between dies 44 and package component 20. Polymer 50 may be an underfill, and hence is referred to as underfill 50 hereinafter, although it may also comprise other polymers such as an epoxy. Underfill 50 may also be a molding underfill.

Molding material 52, which may be a polymer, is molded on dies 44 and package component 20, for example, using compress molding. In some embodiments, molding material 52 comprises a molding compound, an epoxy, or the like. A curing step is performed to cure molding material 52, wherein the curing may be a thermal curing, a Ultra-Violet (UV) curing, or the like. In the embodiments dies 44 are buried in molding material 52, after the curing of molding material 52, a planarization step, such as a grinding, may be performed to remove excess portions of molding material 52, which excess portions are over top surfaces 46A of device dies 44. Accordingly, surfaces 46A of substrates 46 are exposed, and are level with top surface 52A of molding material 52.

Figure 2:
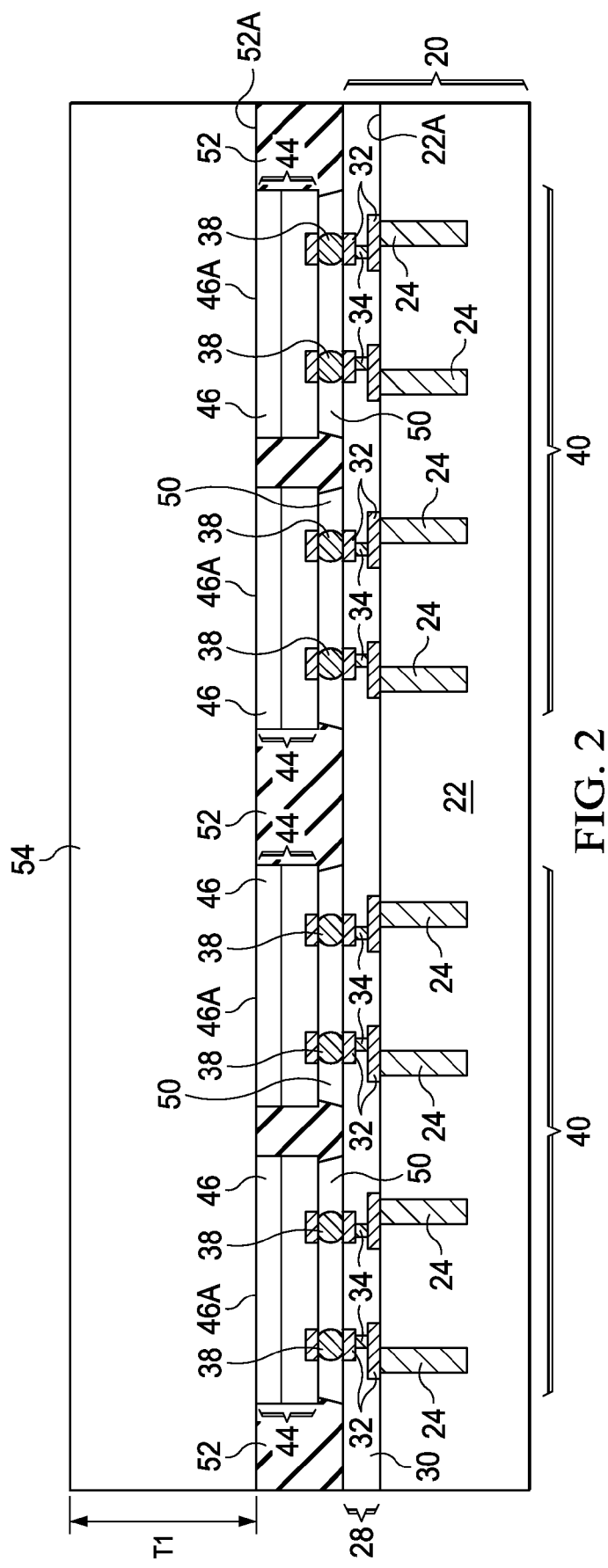

Referring to FIG. 2, thermal-conductive carrier 54 is bonded to surfaces 46A through direct bonding, wherein thermal-conductive carrier 54 is in physical contact with surfaces 46A of substrates 46. The top-view size and the shape of thermal-conductive carrier 54 may substantially match the respective top-view size and the shape of package component 20. In some embodiments, thermal-conductive carrier 54 is a silicon wafer, which may include crystalline silicon. In alternative embodiments, thermal-conductive carrier 54 includes a metal such as copper, aluminum, gold, and/or the like. In yet alternative embodiments, thermal-conductive carrier 54 includes silicon carbide, boron nitride, diamond, or the like. Thermal-conductive carrier 54 may also be the bulk wafer formed of the bulk metal, bulk silicon carbide, bulk boron nitride, bulk diamond, or the like. The thermal conductivity of thermal-conductive carrier 54 may be greater than about 100 Watts/m*K, or greater than about 150 Watts/m*K. Thickness T1 of thermal-conductive carrier 54 may be greater than about 50 µm in some exemplary embodiments.

Before bonding thermal-conductive carrier 54 to substrates 46, the surfaces of thermal-conductive carrier 54 and/or substrates 46 of dies 44 may be activated in a vacuum environment. In some exemplary embodiments, the activation includes the plasma treatment of the surfaces of thermal-conductive carrier 54 and substrates 46 using process gases such as nitrogen ($N_2$). The activated surfaces of thermal-conductive carrier 54 and substrates 46 are put into contact with each other in a further vacuum environment, with a force applied to push thermal-conductive carrier 54 and substrates 46 against each other. As a result, bonds are formed between thermal-conductive carrier 54 and substrates 46. In the embodiments wherein thermal-conductive carrier 54 and substrates 46 are a silicon wafer and silicon substrates, respectively, silicon-to-silicon bonds are formed. It is observed that no Thermal Interface Material (TIM) is disposed between thermal-conductive carrier 54 and substrates 46, and no polymer is used to bond thermal-conductive carrier 54 and substrates 46.

Figure 3:
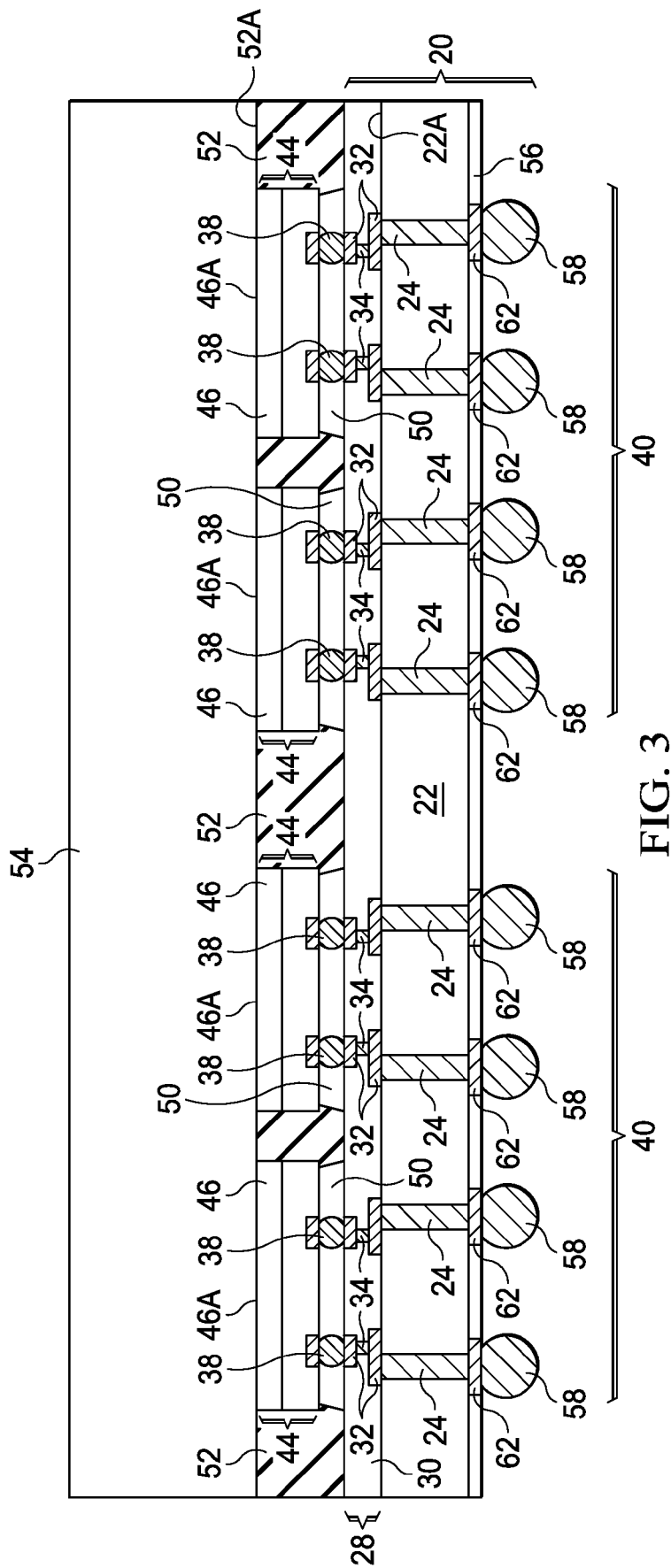

FIG. 3 illustrates the formation of the backside structure of package component 20. In the formation of the backside structure, a backside grinding is performed on the backside of semiconductor substrate 22 to thin semiconductor substrate 22, until TVs 24 are exposed. Dielectric layer (or dielectric layers) 56 is formed on the backside of semiconductor substrate 22. Connectors 58 are also formed on the backside of package component 20 and electrically coupled to TVs 24. In some embodiments, connectors 58 are solder balls. In other embodiments, connectors 58 may comprise metal pads, metal bumps, solder caps, or the like. RDLs may be formed on the backside of package component 20 and in dielectric layers 56, wherein features 62 represent the RDLs. Connectors 58 may be used to bond to an additional electrical component (not shown), which may be a semiconductor substrate, a package substrate, a printed circuit board (PCB), or the like.

Figure 4:
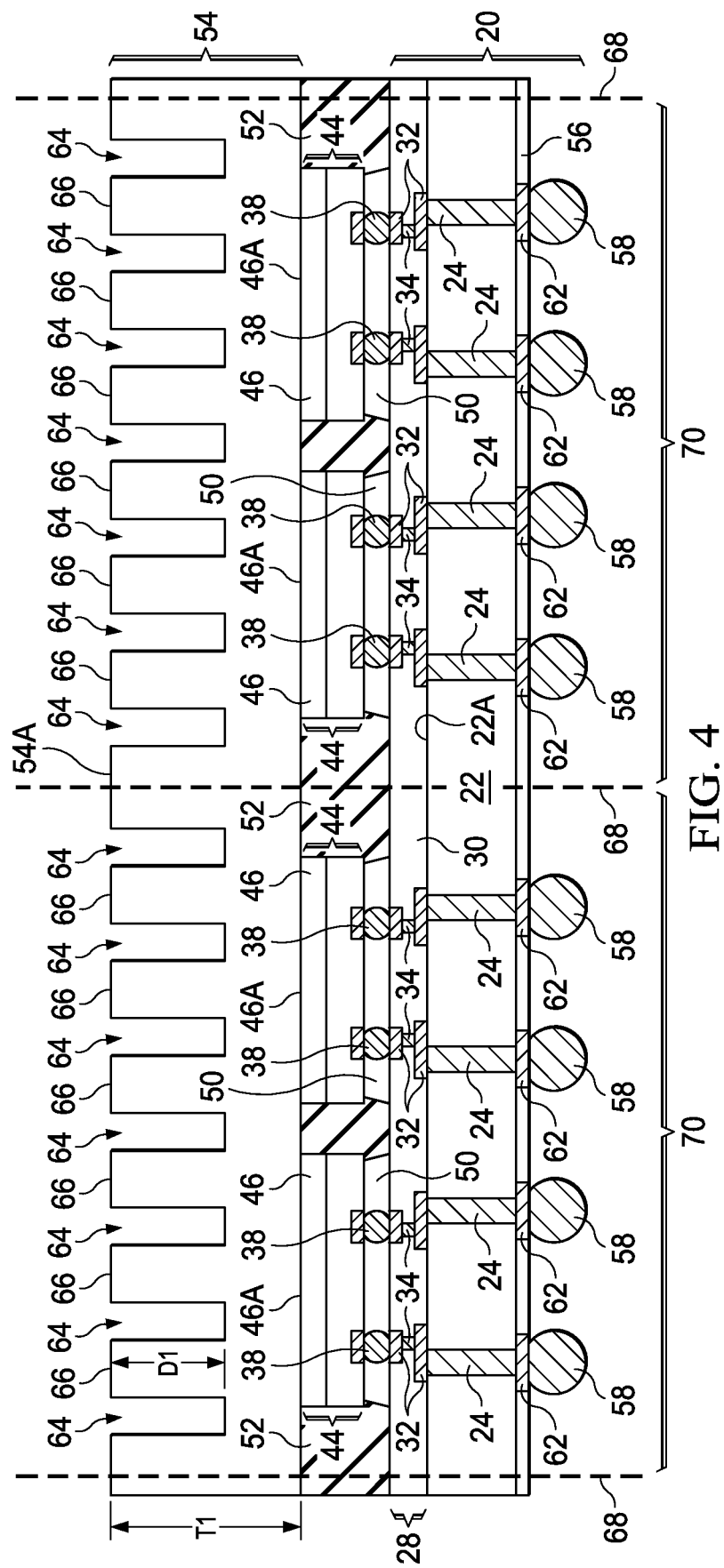

Next, as shown in FIG. 4, trenches 64 are formed in thermal-conductive carrier 54 to convert thermal-conductive carrier 54 into a heat sink, which is also referred to as heat sink 54. Trenches 64 may be formed through etching. Alternatively, trenches 64 are formed by sawing thermal-conductive carrier 54 using a blade. In the top view of heat sink 54, trenches 64 may include a first plurality of trenches parallel to each other. Trenches 64 may, or may not, include a second plurality of trenches parallel to each other, wherein the second plurality of trenches may be perpendicular to the first plurality of trenches. Trenches 64 extend from top surface 54A to an intermediate level of thermal-conductive carrier 54. In some embodiments, depth D1 of trenches 64 may be between about 8 times and about 35 times thickness T1 of thermal-conductive carrier 54. The resulting heat sink 54 includes a plurality of pillars 66 between trenches 64. Pillars 66 may also form an array. The formation of a Chip-on-Wafer package is thus finished.

Figure 5:
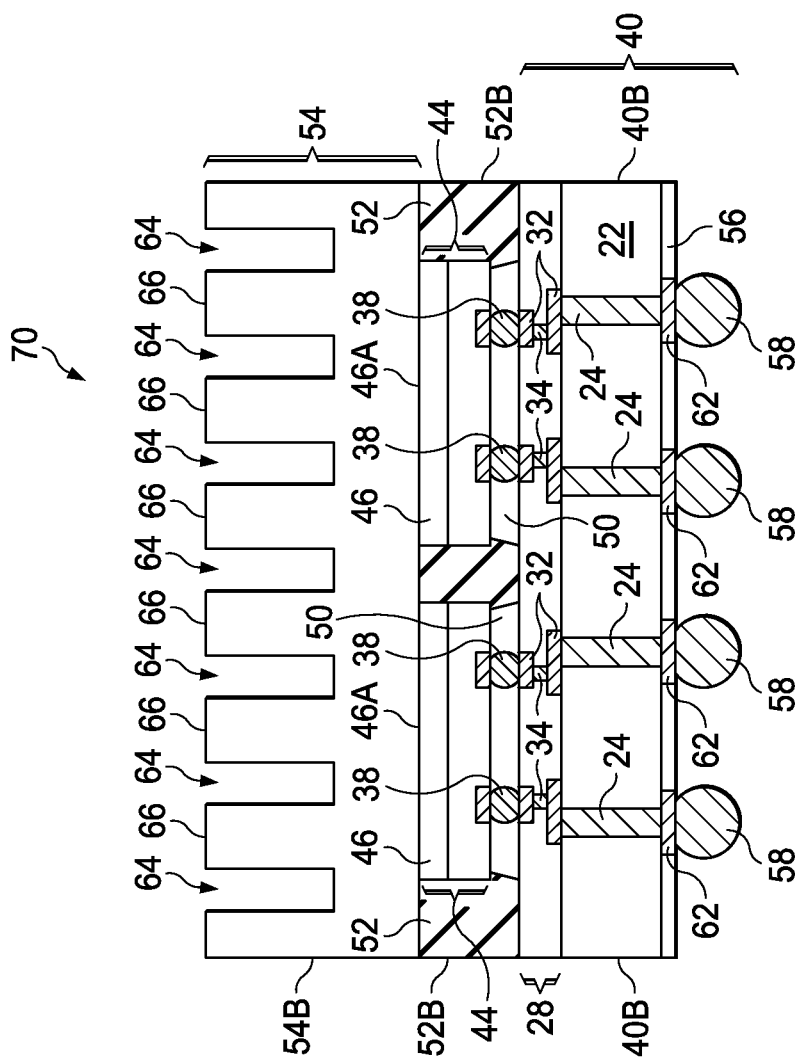

Next, a dicing is performed along scribe lines 68 to saw the package shown in FIG. 4 into a plurality of packages 70. One of the resulting packages 70 is illustrated in FIG. 5, which includes a piece of heat sink 54, die 40, and dies 44. It is observed that in package 70, edges 54B of heat sink 54 are aligned to the corresponding edges 52B of molding material 52, and are aligned to the corresponding edges 40B of die 40. Furthermore, the size and the top-view shape of heat sink 54 are the same as the size and the top-view shape, respectively, of die 40.

Figure 6:
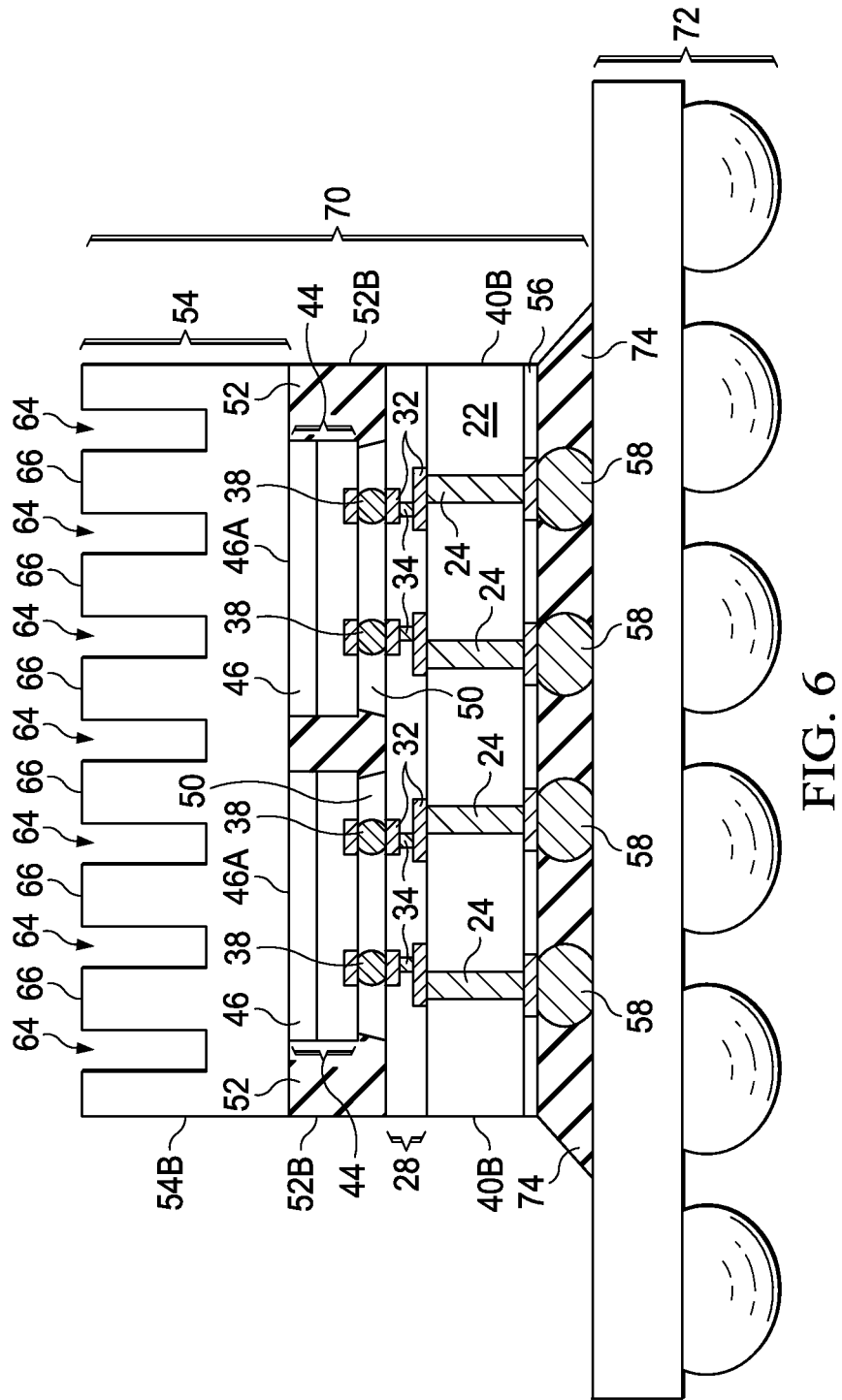

FIG. 6 illustrates the bonding of package 70 to package component 72, for example, through connectors 58. Package component 72 may be a package substrate, a Printed Circuit Board (PCB), or the like. Underfill 74 may be dispensed into the space between package 70 and package component 72, and cured.

In the embodiments, since heat sink 54 is bonded to substrate 46 through direct bonding, with no TIM disposed therebetween, the heat dissipating efficiency of the resulting package is improved. As a result, heat sink 54 may have a small top-view size, which may be the same as the top-view sizes of the underlying components such as die 40, and the heat dissipating efficiency is not sacrificed. The form factor of the resulting package is thus improved. Furthermore, by using the embodiments, carrier 54 as shown in FIG. 3 is used to form the heat sink, and does not need to be demounted before the dicing of the resulting package.

In accordance with embodiments, a device includes a package component, and a die over and bonded to the package component. The die includes a substrate. A heat sink is disposed over and bonded to a back surface of the substrate through direct bonding.

In accordance with other embodiments, a device includes a wafer, which further includes a plurality of chips. A plurality of dies is over and bonded to the plurality of chips, wherein each of the plurality of dies includes a substrate. A molding material is disposed in the gaps between the plurality of dies. A heat sink is bonded to the top surfaces of the substrates of the plurality of dies through direct bonding.

In accordance with yet other embodiments, a method includes bonding a carrier onto a package. The package includes a wafer including a first substrate, and a plurality of vias extending from a top surface of the first substrate into the first substrate. The package further includes a plurality of dies over and bonded to the wafer, wherein each of the plurality of dies includes a second substrate. The carrier is bonded to the top surfaces of the second substrates of the plurality of dies. After the step of bonding the carrier, a backside grinding is performed on the first substrate of the wafer to expose the plurality of vias. Connectors are then formed to connect to the plurality of vias, wherein the connectors and the carrier are on opposite sides of the wafer. Trenches are then formed in the carrier to convert the carrier into a heat sink.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
   a first package component;
   a die over and bonded to the first package component, wherein the die comprises a silicon substrate;
   a heat sink over and bonded to a back surface of the silicon substrate, wherein the heat sink comprises silicon, and wherein a surface of the silicon is in physical contact with the back surface of the silicon substrate of the die; and
   a molding material encircling the die, wherein the molding material comprises edges aligned to corresponding edges of the heat sink, and wherein the edges of the molding material are further aligned to corresponding edges of the first package component.

2. The device of claim 1, wherein the first package component further comprises:
   an additional substrate;
   through vias penetrating through the additional substrate and electrically coupled to the die; and
   connectors at a bottom surface of the first package component, wherein the connectors and the die are on opposite sides of the first package component.

3. The device of claim 2 further comprising a second package component, wherein the first package component and the second package component are bonded to each other through the connectors.

4. The device of claim 1, wherein the heat sink and the silicon substrate are bonded through silicon-to-silicon bonding.

5. A device comprising:
   a first package component;
   a die over and bonded to the first package component, wherein the die comprises a silicon substrate; and
   a heat sink over and bonded to a back surface of the silicon substrate, wherein the heat sink comprises a plurality of pillars separated from each other by trenches, and wherein the silicon substrate is in contact with the heat sink, with the heat sink bonded to the silicon substrate through silicon-to-silicon bonding.

6. The device of claim 5, wherein a portion of the heat sink in contact with the silicon substrate comprises silicon.

7. The device of claim 6, wherein the plurality of pillars is formed of silicon.

8. The device of claim 6, wherein substantially an entirety of the heat sink is formed of crystalline silicon.

9. The device of claim 5 further comprising a molding material encircling the die, wherein the molding material comprises edges aligned to corresponding edges of the heat sink, and wherein the edges of the molding material are further aligned to corresponding edges of the first package component.

10. The device of claim 5, wherein the first package component further comprises:
    an additional substrate;
    through vias penetrating through the additional substrate and electrically coupled to the die; and
    connectors at a bottom surface of the first package component, wherein the connectors and the die are on opposite sides of the first package component.

11. The device of claim 10 further comprising a second package component, wherein the first package component and the second package component are bonded to each other through the connectors.

12. A device comprising:
    a molding compound;
    a device die molded by the molding compound, wherein the device die comprises a silicon substrate;
    a silicon heat sink free from integrated circuit therein, wherein the silicon heat sink comprises:
       a first surface in contact with a back surface of the silicon substrate;
       a second surface opposite to the first surface; and
       trenches extending from the second surface into the silicon heat sink, wherein portions of the silicon heat sink between the trenches form fins; and
    an interposer bonded to the device die, wherein the interposer and the silicon heat sink are on opposite sides of the device die.

13. The device of claim 12, wherein the first surface of the silicon heat sink is further in contact with the molding compound.

14. The device of claim 12, wherein the molding compound overlaps portions of the interposer.

15. The device of claim 12, wherein the first surface of the silicon heat sink is bonded to the back surface of the silicon substrate through silicon-to-silicon bonds.

16. The device of claim 12 further comprising an additional device die molded by the molding compound, wherein the additional device die comprises an additional silicon substrate in contact with, and bonded to, the first surface of the silicon heat sink.

* * * * *